United States Patent
Saito et al.

(10) Patent No.: US 7,684,514 B2
(45) Date of Patent: Mar. 23, 2010

(54) TRANSMITTER APPARATUS AND WIRELESS COMMUNICATION APPARATUS

(75) Inventors: Noriaki Saito, Machida (JP); Koichiro Tanaka, Takarazuka (JP); Mitsuru Tanabe, Katano (JP)

(73) Assignee: Panasonic Corporation, Osaka (JP)

( * ) Notice: Subject to any disclaimer, the term of this patent is extended or adjusted under 35 U.S.C. 154(b) by 790 days.

(21) Appl. No.: 10/597,153

(22) PCT Filed: Jan. 11, 2005

(86) PCT No.: PCT/JP2005/000179
§ 371 (c)(1),
(2), (4) Date: Jul. 13, 2006

(87) PCT Pub. No.: WO2005/017849
PCT Pub. Date: Aug. 4, 2005

(65) Prior Publication Data
US 2007/0291873 A1 Dec. 20, 2007

(30) Foreign Application Priority Data
Jan. 27, 2004 (JP) ............................. 2004-017955
Dec. 6, 2004 (JP) ............................. 2004-352464

(51) Int. Cl.
*H04L 25/49* (2006.01)
*H04L 27/20* (2006.01)
*H03F 1/26* (2006.01)
*H04B 1/02* (2006.01)

(52) U.S. Cl. .................... 375/297; 375/308; 330/149; 332/103; 455/69; 455/114.3; 455/127.3

(58) Field of Classification Search ............... 375/221, 375/295–298, 300, 308; 330/149; 332/103, 332/145, 149, 155, 157, 162; 455/69, 108, 455/114.2, 114.3, 127.1, 127.2, 127.3
See application file for complete search history.

(56) References Cited

U.S. PATENT DOCUMENTS

| | | | |
|---|---|---|---|
| 5,432,473 A * | 7/1995 | Mattila et al. | ............... 330/133 |
| 6,043,707 A | 3/2000 | Budnik | |
| 6,567,653 B1 * | 5/2003 | Sanders | ...................... 455/126 |
| 2002/0071497 A1 * | 6/2002 | Bengtsson et al. | .......... 375/298 |

(Continued)

FOREIGN PATENT DOCUMENTS

JP 3-276923 12/1991

(Continued)

OTHER PUBLICATIONS

European Search Report dated Apr. 2, 2009.

*Primary Examiner*—Young T. Tse
(74) *Attorney, Agent, or Firm*—Pearne & Gordon LLP

(57) ABSTRACT

A transmitter providing a wide output control variable width with high efficiency is provided. Saturation mode operation is performed in the vicinity of the maximum transmission power and the input level of a large power amplifier is enlarged and fixed. When the large power amplifier is operated in a saturation state, the amplitude component of a modulation signal is input to an R input terminal in the range responsive to an output power control level and power supply voltage of a power supply terminal is amplitude-modulated, whereby highly efficient polar coordinate modulation is performed. In smaller transmission power, linear mode operation is performed, the input level of the large power amplifier is lessened for operating the large power amplifier in the linear mode, and the power supply voltage of the power supply terminal is made variable in response to the output power control level, whereby transmission power control is performed.

11 Claims, 11 Drawing Sheets

U.S. PATENT DOCUMENTS

| | | | |
|---|---|---|---|
| 2004/0219891 A1* | 11/2004 | Hadjichristos | 455/102 |
| 2005/0135502 A1* | 6/2005 | Zhang et al. | 375/297 |
| 2006/0046666 A1* | 3/2006 | Hara et al. | 455/127.1 |

FOREIGN PATENT DOCUMENTS

| | | |
|---|---|---|
| JP | 05-034732 A | 2/1993 |
| JP | 3044057 | 3/2000 |
| JP | 2002-033672 A | 1/2002 |
| JP | 2003-18026 | 1/2003 |
| JP | 2003-023468 A | 1/2003 |
| JP | 2003-51751 | 2/2003 |
| JP | 2004-104194 | 4/2004 |
| JP | 2004-173249 | 6/2004 |
| WO | 00/30250 A1 | 5/2000 |

* cited by examiner

FIG. 2

GSM900 POWER CLASS E2

| POWER CONTROL LEVEL | ANTENNA TERMINAL OUTPUT LEVEL [dBm] | LARGE POWER AMPLIFIER OUTPUT LEVEL [dBm] | MODE SWITCH |
|---|---|---|---|
| 8 | 27 | 28 | SATURATION MODE (POLAR COORDINATE MODULATION SYSTEM) |
| 9 | 25 | 26 | SATURATION MODE (POLAR COORDINATE MODULATION SYSTEM) |
| 10 | 23 | 24 | SATURATION MODE (POLAR COORDINATE MODULATION SYSTEM) |
| 11 | 21 | 22 | LINEAR MODE (QUADRATURE MODULATION SYSTEM) |
| 12 | 19 | 20 | LINEAR MODE (QUADRATURE MODULATION SYSTEM) |
| 13 | 17 | 18 | LINEAR MODE (QUADRATURE MODULATION SYSTEM) |
| 14 | 15 | 16 | LINEAR MODE (QUADRATURE MODULATION SYSTEM) |
| 15 | 13 | 14 | LINEAR MODE (QUADRATURE MODULATION SYSTEM) |
| 16 | 11 | 12 | LINEAR MODE (QUADRATURE MODULATION SYSTEM) |
| 17 | 9 | 10 | LINEAR MODE (QUADRATURE MODULATION SYSTEM) |
| 18 | 7 | 8 | LINEAR MODE (QUADRATURE MODULATION SYSTEM) |
| 19~31 | 5 | 6 | LINEAR MODE (QUADRATURE MODULATION SYSTEM) |

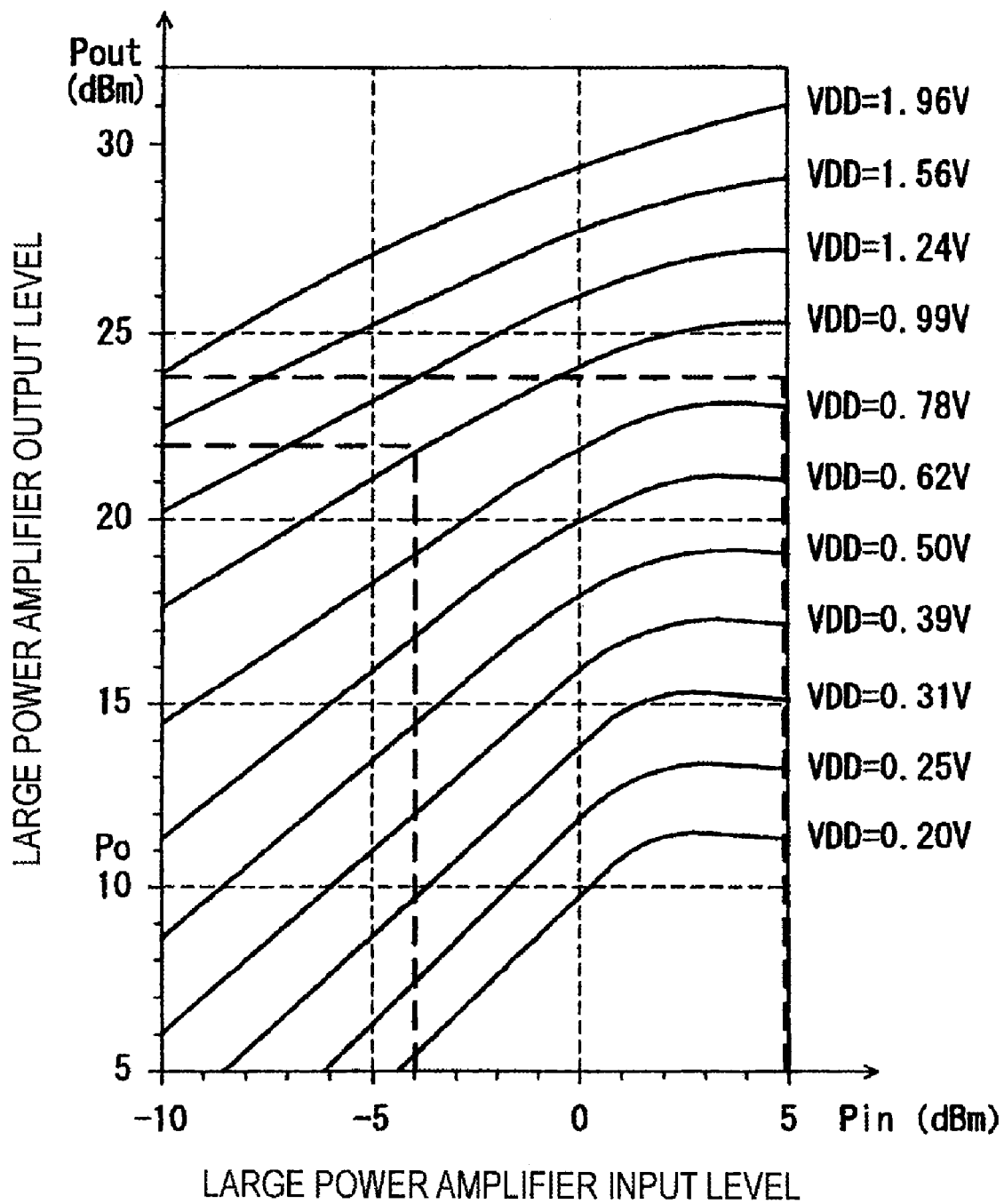

TRANSMITTER APPARATUS AND WIRELESS COMMUNICATION APPARATUS

TECHNICAL FIELD

This invention relates to a transmitter whose output can be controlled variably and a wireless communication apparatus using the transmitter.

BACKGROUND ART

For a transmitter whose output can be controlled variably, the power efficiency and the linearity in a transmission function are evaluated as indicators for measuring the performance of the apparatus. The power efficiency and the linearity in the transmission function are the most important indicators to represent the performance of the apparatus particularly in a high-frequency modulation transmission machine such as a mobile telephone.

An amplifier of class A operation is widely used as an amplifier at the last stage of such a high-frequency modulation transmission machine. The class A amplifier has small distortion, namely, is excellent in linearity, but provides small power efficiency because it consumes power accompanying a DC bias component at all times.

Then, designed as a method of operating a power amplifier with a high degree of efficiency is a method of changing drain voltage or collector voltage (power supply voltage) in response to the amplitude component of a baseband signal for amplification using the saturation region of the input/output power characteristic of a transistor. For example, when average output power is changed, the above-mentioned power supply voltage is changed in proportion to any desired average output power. As this kind of apparatus, for example, an output variable transmitter disclosed in Japanese Patent No. 3044057 (patent document 1) is available.

FIG. 11 is a block diagram to show the configuration of an output variable transmitter in a related art example. This output variable transmitter includes modulation input terminals 101 and 102, a carrier oscillator 104, a quadrature modulator 103 for performing quadrature modulation of outputs of the modulation input terminals 101 and 102 at the output frequency of the carrier oscillator 104, a high-frequency power amplifier 105, a transmission output terminal 106, an envelop generation circuit 107 for generating an envelope from the outputs of the modulation input terminals 101 and 102, a specification signal input terminal 112, a multilevel DC signal generation circuit 108 for inputting a signal for setting the average output level of the power amplifier 105 from the specification signal input terminal 112 and generating a DC signal corresponding to the input value of the signal, a multiplication circuit 109 for multiplying the output envelop of the envelop generation circuit 107 by output of the multilevel DC signal generation circuit 108, a voltage control circuit 110 for controlling drain voltage of the power amplifier 105 in response to output of the multiplication circuit 109, and a power supply terminal 111.

The quadrature modulator 103 modules the carrier supplied from the carrier oscillator 104 according to an I signal input from the modulation input terminals 101 and 102 and a Q signal orthogonal to the I signal. The envelop generation circuit 107 calculates an amplitude signal R of the I and Q signals. An output level specification signal corresponding to the transmission output level to output to the transmission output terminal 106 is input to the specification signal input terminal 112. The multilevel DC signal generation circuit 108 generates a DC signal in accordance with the output level specification signal from the specification signal input terminal 112.

The multiplication circuit 109 multiplies the output of the envelop generation circuit 107 by the output of the multilevel DC signal generation circuit 108. Accordingly, a signal proportional to the envelop of the modulated wave is obtained in the output of the multiplication circuit 109 and moreover the average value changes with transmission output. The voltage control circuit 110 changes drain voltage Vo of the power amplifier 105 in response to the output of the multiplication circuit 109. Consequently, the drain voltage of the power amplifier 105 is proportional to the envelop of the modulated wave and the average value changes with transmission output. Therefore, using the configuration of the polar coordinate modulation system as described above, the power amplifier 105 can perform linear amplification while holding the saturation state of high efficiency, and moreover transmission output can be made variable.

However, in the output variable transmitter in the related art example shown in FIG. 11, both amplitude modulation and transmission output control are always performed collectively as drain voltage control and thus the output control variable width of the transmission power is limited by the characteristic of the power amplifier 105. To install the output variable transmitter in the related art example in an actual mobile telephone, finite control voltage range (for example, 0.3 V to 3.0 V) and power amplifier gain variable width (for example, 20 dB/dec) can only be secured. Thus, the necessary transmission output level range cannot sufficiently be secured in a communication apparatus requiring a wide output control variable width as in a recent mobile telephone standard (for example, about 43 dB+α in EGPRS of European mobile telephone standard).

The frequency at which a mobile telephone operates with the maximum transmission output is comparatively low. This is caused by the fact that the transmission power is set low by a command of a base station to avoid interference and enhance the cell use efficiency. Therefore, to prolong the conversion-possible time of a mobile telephone, suppressing the power consumption not only at the maximum transmission output time, but also at the low transmission output time is an important problem.

Patent document 1: Japanese Patent No. 3044057 (p1-p20, FIG. 1)
Patent document 2: JP-A-2003-18026
Patent document 3: JP-A-2003-51751
Patent document 4: JP-A-2004-104194
Patent document 5: JP-A-2004-173249
Patent document 6: JP-A-3-276923

DISCLOSURE OF THE INVENTION

Problems that the Invention is to Solve

It is therefore an object of the invention to provide a transmitter and a wireless communication apparatus capable of providing a wide output control variable width with high efficiency.

Means for Solving the Problems

According to the invention, there is provided a transmitter comprising quadrature modulation means for inputting an in-phase component and a quadrature component of an input modulation signal and performing quadrature modulation; variable gain amplification means for amplifying output of the quadrature modulation means with a gain being controlled based on a gain control signal; and power amplification means for performing power amplification of output of the variable gain amplification means, wherein the power amplification means has a linear mode for performing power amplification using a linear operation region in an input/output power characteristic and a saturation mode for performing power amplification using a saturation operation region in the input/output power characteristic, and wherein if transmission output power is equal to or greater than a predetermined value, the output level of the variable gain amplification means is adjusted, the power amplification means is operated in the saturation mode, and a transmission output control signal amplitude-modulated based on an amplitude component of the input modulation signal is input to an output control input terminal of the power amplification means for performing polar coordinate modulation; if the transmission output power is less than the predetermined value, the output level of the variable gain amplification means is adjusted, the power amplification means is operated in the linear mode, and a transmission output control signal of a predetermined level responsive to the transmission output power is input to the output control input terminal for performing linear amplification.

According to the configuration, if the transmission output power is equal to or greater than the predetermined value, highly efficient polar coordinate modulation is performed and if the transmission output power is smaller than the predetermined value, linear amplification can be performed; the output control variable width can be widened according to the two types of operation. Therefore, amplitude modulation and transmission power control in the polar coordinate modulation can be separated for control and dynamic range shortage in the polar coordinate modulation system can be eased and it is made possible to provide a wide output control variable width with high efficiency.

As one form of the invention, in the transmitter, if the transmission output power is at the maximum output level or in the proximity thereof, the power amplification means performs the polar coordinate modulation and if the transmission output power is smaller than the maximum output level or the proximity thereof, the power amplification means performs the linear amplification.

According to the configuration, highly efficient polar coordinate modulation is performed in the vicinity of the maximum output level of the transmission output power and linear amplification is performed in the smaller transmission output power, whereby highly efficient amplification according to polar coordinate modulation is possible in the vicinity of the maximum output level and if the output level is small, transmission output control is possible in a wide range of output levels by linear amplification. Thus, for example, transmission output control in such a wide range exceeding the gain variable width in the power amplification means is also easily possible.

As one form of the invention, in the transmitter, the power amplification means comprises a power supply terminal used as the output control input terminal, the transmitter further comprising a power supply driver for increasing the current capacity of the signal of the predetermined level or the signal amplitude-modulated based on the amplitude component of the input modulation signal and supplying power to the power supply terminal as the transmission output control signal.

According to the configuration, the power supply driver enhances the current capacity of the signal amplitude-modulated based on the amplitude component of the input modulation signal and supplies to the power supply terminal of the power amplification means as the transmission output control signal, whereby if the transmission output power is equal to or greater than the predetermined value, highly efficient polar coordinate modulation can be performed.

As one form of the invention, in the transmitter, the power amplification means comprises a power supply terminal to which fixed power supply is input, and an amplification circuit bias terminal used as the output control input terminal to which the transmission output control signal is input.

According to the configuration, fixed power supply is input to the power supply terminal of the power amplification means and the signal amplitude-modulated based on the amplitude component of the input modulation signal is input to the bias terminal as the transmission output control signal, whereby if the transmission output power is equal to or greater than the predetermined value, highly efficient polar coordinate modulation can be performed. In the configuration, the need for the power supply driver for enhancing the current capacity is eliminated and the apparatus configuration can be simplified as compared with the case where the power supply to the power amplification means is amplitude-modulated.

As one form of the invention, the transmitter further comprises a transmission output control signal input section for inputting the transmission output control signal, wherein the transmission output control signal input section comprises a DA converter for converting a digital signal into an analog signal, and wherein the DA converter can change an operation clock and has an operation clock switch function for operating with a higher operation clock than that when the linear amplification is performed only when polar coordinate modulation is performed in the power amplification means.

According to the configuration, the DA converter of the transmission output control signal input section is operated with a high operation clock only when polar coordinate modulation is performed in the power amplification means, whereby the operation current is increased and appropriate amplitude modulation is made possible only at the polar coordinate modulation operation time and the operation current can be decreased at the linear amplification operation time and the whole power consumption can be reduced.

As one form of the invention, in the transmitter, an input section of the power supply driver comprises an operational amplifier for waveform shaping, and the operational amplifier can change an operation current and has an operation current switch function for increasing the operation current as compared with that when the linear amplification is performed only when polar coordinate modulation is performed in the power amplification means.

According to the configuration, the operation current of the operational amplifier of the input section of the power supply driver is increased only when polar coordinate modulation is performed in the power amplification means, whereby appropriate amplitude modulation is made possible with large operation current at the polar coordinate modulation operation time and the operation current can be decreased at the linear amplification operation time and the whole power consumption can be reduced.

As one form of the invention, in the transmitter, a liner regulator is used as the power supply driver.

As one form of the invention, in the transmitter, a switching regulator is used as the power supply driver.

As one form of the invention, in the transmitter, the power supply driver includes amplitude slice means for slicing the transmission output control signal at stepwise different voltage levels, a plurality of switching regulators for converting the power supply voltage into voltages of stepwise different values, and a switch group for selecting any one of the output voltages of the plurality of switching regulators.

As one form of the invention, the transmitter further includes a demodulation section for demodulating output of the power amplification means; and a control section for adjusting the timing of amplitude modulation when polar coordinate modulation is performed in the power amplification means based on information of a demodulation signal provided by the demodulation section.

According to the configuration, timing adjustment of amplitude information and phase information at the polar coordinate modulation time is made possible based on the information provided by demodulating the output of the power amplification means (for example, EVM (error vector magnitude (value indicating modulation accuracy), etc.), and it is made possible to decrease distortion of the output of the transmitter.

According to the invention, there is provided a wireless communication apparatus including any of the transmitters described above. In the wireless communication apparatus of the configuration, highly efficient amplification with large transmission output power is possible and transmission power control is possible at a wide level; the invention is more effective if the invention is applied to a small and mobile wireless communication apparatus such as a mobile telephone.

ADVANTAGES OF THE INVENTION

According to the invention, the transmitter and the wireless communication apparatus capable of providing a wide output control variable width with high efficiency can be provided.

BRIEF DESCRIPTION OF THE DRAWINGS

FIG. 2 A drawing to show transmission power control standard in 900-MHz band EGPRS system of European mobile telephone standard.

FIG. 3 A drawing to show the input/output characteristic of a large power amplifier in the embodiment.

Figure 1:
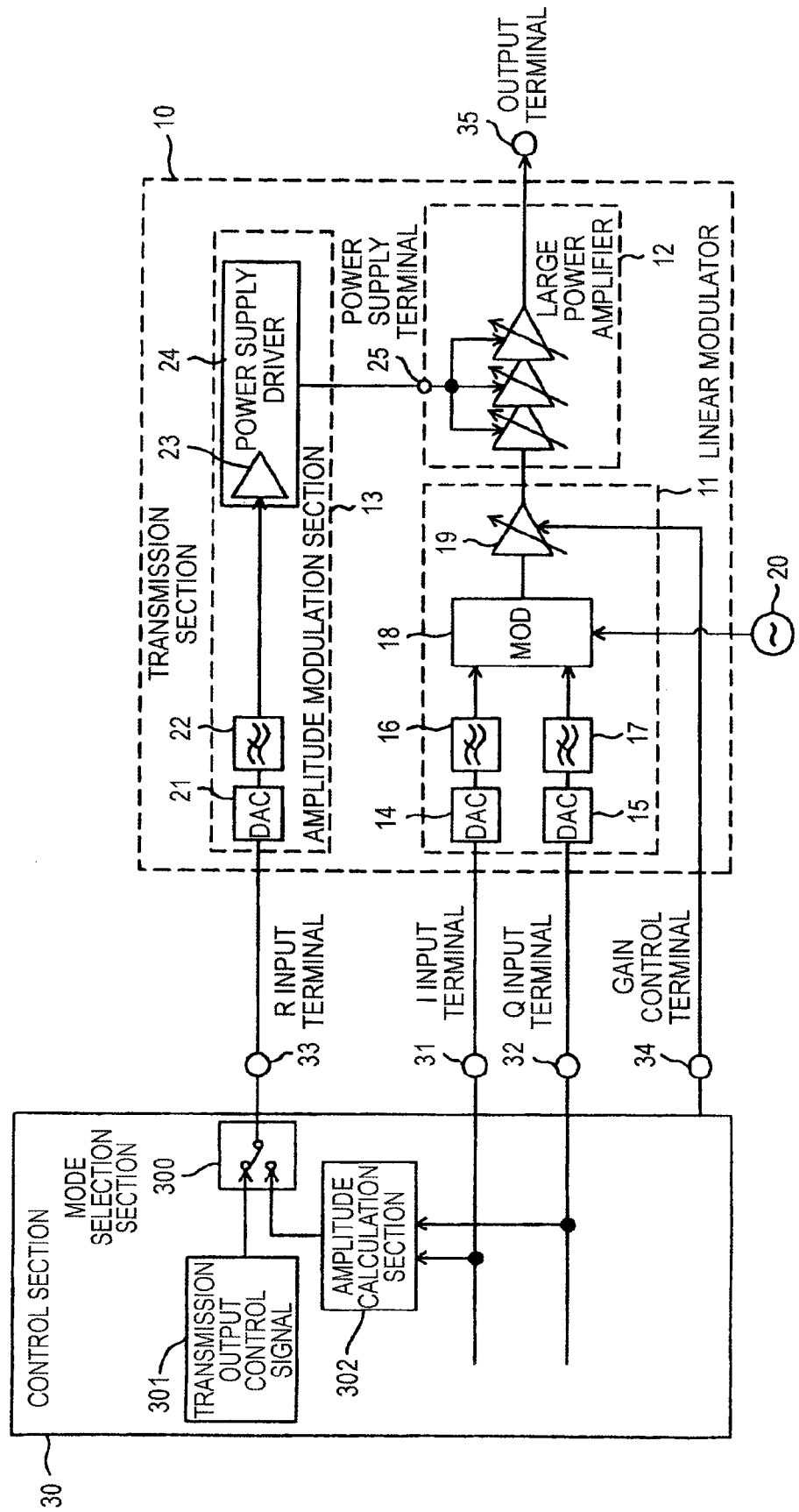
FIG. 1 A block diagram to show the configuration of a transmitter according to a first embodiment of the invention.

| DESCRIPTION OF REFERENCE NUMERALS |
|---|
| 10, 40, 50, 60, 200 Transmission section |
| 11 Liner modulator |
| 12, 62 Large power amplifier |
| 13, 41, 51, 61, 201 Amplitude modulation section |
| 14, 15, 21 Fixed clock input DA converter (DAC) |
| 16, 17, 22, 76, 77 Low-pass filter (LPF) |
| 18 Quadrature modulator |
| 19 Medium power amplifier |
| 20 Local oscillator |
| 23, 52 High-speed operational amplifier |
| 24, 53, 203 Power supply driver |
| 25, 63 Power supply terminal |
| 30, 80 Control section |
| 31 I input terminal |
| 32 Q input terminal |
| 33 R input terminal |
| 34, 93 Gain control terminal |
| 35 Output terminal |
| 36 Clock switch terminal |
| 37 Current switch terminal |
| 42 Variable clock input DA converter |
| 64 Bias terminal |
| 65 Fixed power supply |
| 70 Reception section |
| 71 Band-pass filter (BPF) |
| 72 Low noise amplifier |
| 73 Quadrature demodulator |
| 74, 75 Baseband amplifier |
| 78, 79 AD converter (ADC) |
| 81 Antenna switch |
| 82 Antenna |
| 91 I output terminal |
| 92 Q output terminal |
| 204 Amplitude slice means |
| 205, 206 Switch |
| 207 Linear regulator |
| 208, 209 Switching regulator |
| 210 Voltage source |
| 300 Mode selection section |
| 301 Transmission output control signal |
| 302 Amplitude calculation section |

BEST MODE FOR CARRYING OUT THE INVENTION

In each embodiment, a configuration example of applying to a mobile telephone is shown as an example of a wireless communication apparatus including a transmitter.

First Embodiment

FIG. 1 is a block diagram to show the configuration of a transmitter according to a first embodiment of the invention. A transmission section 10 implementing the transmitter of the first embodiment includes a linear modulator 11, a large power amplifier 12 for performing power amplification of a transmission signal output from the linear modulator 11, and an amplitude modulation section 13 for generating power supplied to the large power amplifier 12.

The linear modulator 11 includes fixed clock input DA converters (DACs) 14 and 15 for executing digital-analog conversion according to an operation clock of a fixed frequency, low-pass filters (LPFs) 16 and 17, a quadrature modulator (MOD) 18 for executing quadrature modulation of outputs of the low-pass filters 16 and 17 at the output frequency of a local oscillator 20 and executing frequency conversion to an RF band, and a medium power amplifier 19 for amplifying output of the quadrature modulator 18.

The amplitude modulation section 13 includes a fixed clock input DA converter 21, a low-pass filter 22, and a power supply driver 24 including a high-speed operational amplifier (OPAMP) 23 for waveform shaping in an output section. The fixed clock input DA converter 21 and the low-pass filter 22 become a transmission output control signal input section for inputting a transmission output control signal described later.

The transmission section 10 has an I input terminal 31 of an in-phase component input terminal, a Q input terminal 32 of a quadrature phase component input terminal, an R input terminal 33 for inputting a transmission output control signal to specify the transmission output power of the control target, a gain control terminal 34 for inputting a gain control signal to control the amplification gain of the medium power amplifier 19, and an output terminal 35 for outputting a power-amplified transmission signal. A control section 30 is connected to the terminals and outputs a transmission modulation signal, various control signals, etc., for controlling the wireless communication operation. The control section 30 includes an amplitude calculation section 302 for calculating the amplitude component of an input modulation signal based on I and Q signals and a mode selection section 300 for selecting either of a transmission output control signal 301 of a given level and the amplitude component of the input modulation signal calculated by the amplitude calculation section 302 to select the operation mode.

In the transmission section 10, the in-phase envelop component (I signal) and the quadrature envelop component (Q signal) of a quadrature modulation digital signal of a baseband to be transmitted are input to the I input terminal 31 and the Q input terminal 32 respectively. The I signal of the in-phase component input to the I input terminal 31 is converted into an analog voltage by the DA converter 14 and an unnecessary harmonic component of the analog voltage is removed through the low-pass filter 16 and then the I signal converted into the analog voltage is input to the quadrature modulator 18. Likewise, the Q signal of the quadrature component input to the Q input terminal 32 is converted into an analog voltage by the DA converter 15 and an unnecessary harmonic component of the analog voltage is removed through the low-pass filter 17 and then the Q signal converted into the analog voltage is input to the quadrature modulator 18.

The quadrature modulator 18, which corresponds to an example of quadrature modulation means, executes quadrature modulation of a high frequency signal supplied from the local oscillator 20 by the input I and Q signals, thereby generating and outputting a high frequency signal of a RF band subjected to phase modulation from the I and Q signals. The medium power amplifier 19, which corresponds to an example of variable gain amplification means, amplifies the output signal of the quadrature modulator 18 with a predetermined gain in response to the level of a gain control signal input from the gain control terminal 34. Output of the medium power amplifier 19 becomes output of the linear modulator 11, which is input to the large power amplifier 12 as a transmission modulation signal.

A digital signal for transmission output control is input to the R input terminal 33 from the control section 30. The transmission output control signal input to the R input terminal 33 is converted into an analog voltage by the DA converter 21 and an unnecessary harmonic component of the analog voltage is removed through the low-pass filter 22 and then the transmission output control signal converted into the analog voltage is increased in current capacity by the power supply driver 24 for enhancement. Output of the power supply driver 24 becomes output of the amplitude modulation section 13, which is supplied to the large power amplifier 12 as power whose voltage can be changed.

The large power amplifier 12, which corresponds to an example of power amplification means, is a power amplifier made up of a plurality of stages of amplification circuits, for example, as shown in the figure, whose output is controlled in response to the input level of a power supply terminal 25 as an output control input terminal. The large power amplifier 12 executes linear amplification in a linear mode described later or amplitude modulation (polar coordinate modulation) in a saturation mode, of the transmission modulation signal output from the linear modulator 11 for power amplification, and outputs the signal from the output terminal 35 as a transmission signal.

In the embodiment, if the transmission output power is low output less than a predetermined value, for example, to use the transmitter with smaller output than the maximum transmission power, the transmission output control signal 301 of a given level is selectively input to the R input terminal 33 through the mode selection section 300 and the linear modulator 11 and the large power amplifier 12 are operated in the linear mode, whereby transmission power control is performed independently of the dynamic range of the amplitude component of the input modulation signal based on the I and Q signals. On the other hand, if the transmission output power is high output equal to or larger than a predetermined value, for example, to use the transmitter in the vicinity of the maximum transmission power (for example, within −2 to 4 dB or within −6 dB, etc.,), the large power amplifier 12 is operated in the saturation mode and the amplitude component of the input modulation signal based on the I and Q signals calculated by the amplitude calculation section 302 is selectively input to the R input terminal 33 through the mode selection section 300 and polar coordinate modulation is performed in the large power amplifier 12. That is, the transmission section 10 of the embodiment includes two stages of amplification means of the linear modulator 11 for performing linear amplification after quadrature modulation and the large power amplifier 12 for performing usual linear amplification or amplification in the saturation state using polar coordinate modulation. The amplification means are controlled by a control signal from the control section 30.

Next, the operation of the transmission section 10 as described above will be discussed in detail. In the description to follow, 900-MHz band EGPRS system of European mobile telephone standard is taken as an example.

FIG. 2 is a drawing to show the transmission power control standard in the 900-MHz band EGPRS system of the European mobile telephone standard. First, the power control operation at each power control level shown in FIG. 2 will be discussed. In the 900-MHz band EGPRS system, in the class called Class E2 in the stipulation of the maximum transmission power, the level needs to be varied in 2-dB steps from power control level 8 to 19. In a terminal of a wireless communication apparatus (mobile station), a baseband control section sends the control value of the power control level in 12 steps to transmission section considering a command from a base station before transmission is started. In the example in FIG. 2, it is assumed that the loss of an antenna switch, etc., is 1 dB between the output terminal 35 of the transmission section shown in FIG. 1 to an antenna terminal.

From power control level 8 (+28 dBm) to level 10 (+24 dBm) in FIG. 2, the output level of the medium power amplifier 19 is fixed to +5 dBm by a gain control signal input from the gain control terminal 34 and the input level of the large power amplifier 12 is held in a saturation operation region, whereby the large power amplifier 12 is operated in the saturation mode (polar coordinate modulation system). At this time, the voltage value of the amplitude component of the modulation signal is input to the R input terminal 33 in the level range shifted in response to the power control level, power is supplied to the large power amplifier 12 through the power supply driver 24, and the voltage of the power supply terminal 25 of the large power amplifier 12 (power supply voltage VDD) is amplitude-modulated, whereby highly efficient polar coordinate modulation is performed.

In power control level 11 (+22 dBm) lower than the above-mentioned levels, a predetermined control voltage value is input to the R input terminal 33 and the power supply voltage VDD of the power supply terminal 25 of the large power amplifier 12 is fixed to 0.99 V and the output level of the medium power amplifier 19 is decreased to −4 dBm by a gain control signal input from the gain control terminal 34, whereby the large power amplifier 12 is operated in the linear mode (quadrature modulation system). Thus, from power control level 11 (+22 dBm) to level 19 (+6 dBm), the output level of the medium power amplifier 19, namely, the input level of the large power amplifier 12 is set to −4 dBm by the gain control signal input from the gain control terminal 34 for holding the input level of the large power amplifier 12 in the linear operation region, whereby the large power amplifier 12 is operated in the linear mode. At this time, the control voltage value responsive to the power control level is input to the R input terminal 33 and the power supply voltage VDD of the power supply terminal 25 is varied in response to the power control level, whereby transmission power control is performed.

Figure 4:
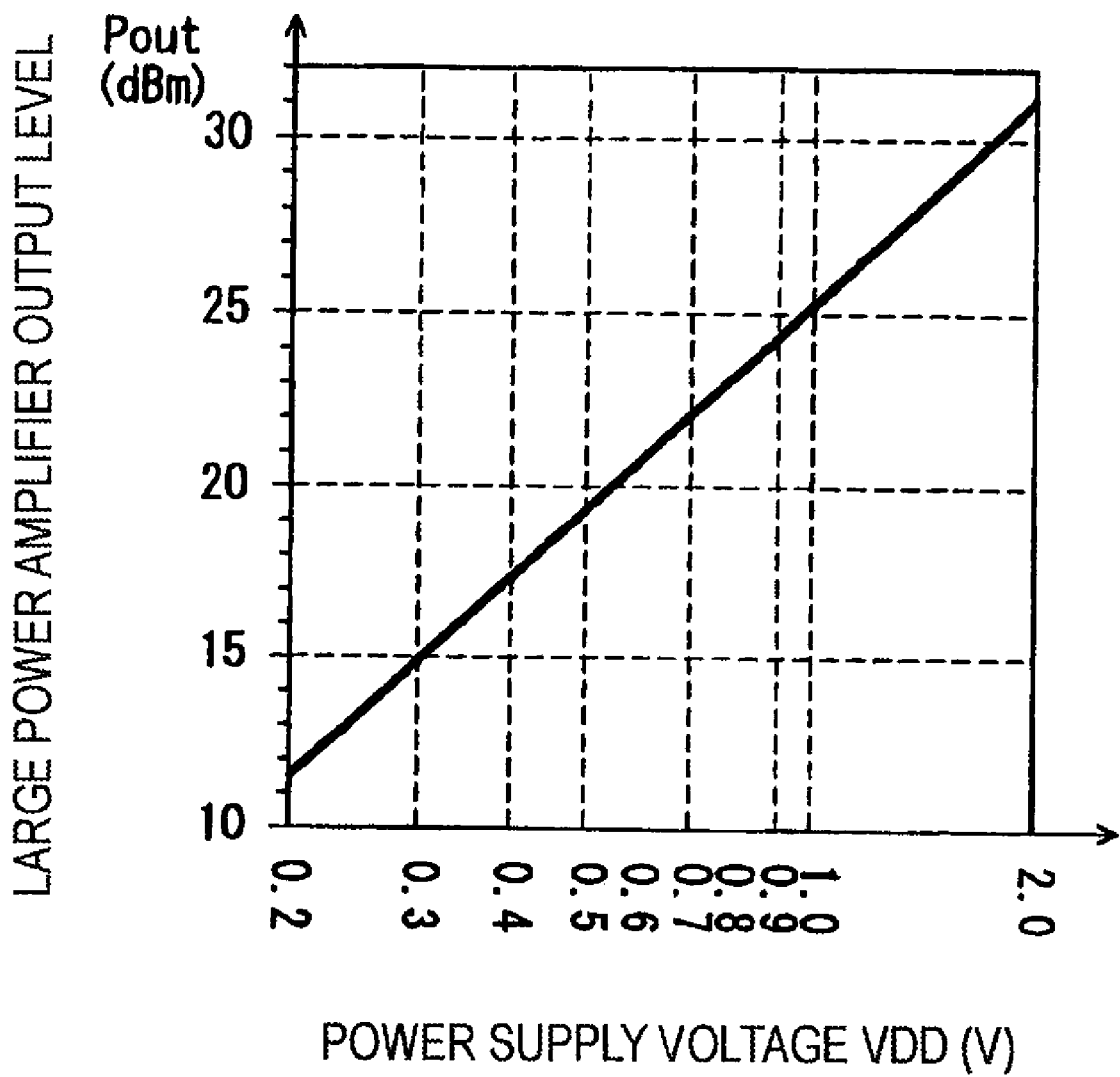
FIG. 4 A power supply voltage vs. power output level characteristic drawing of the large power amplifier in the embodiment.

The operation of the large power amplifier 12 in the linear mode and the saturation mode will be discussed with reference to FIGS. 3 and 4. FIG. 3 is a drawing to show the input/output characteristic (Pin-Pout characteristic) of the large power amplifier 12 with the power supply voltage VDD applied to the power supply terminal 25 as a parameter, and FIG. 4 is a characteristic drawing of power supply voltage VDD vs. output power Pout when the power input level of the large power amplifier 12 is fixed to +5 dBm.

In FIG. 3, a plurality of curves indicate the input/output characteristics (Pin-Pout characteristics) of the large power amplifier 12 with respect to different power supply voltages VDD. If the input power Pin is smaller than every power supply voltage VDD as in FIG. 3, the output power Pout increases linearly (linear operation region) as the input power Pin increases, but if the input power Pin is equal to or greater than one value, saturation occurs in output power Po responsive to each power supply voltage VDD (saturation operation region). The saturation output power Po (W) is proportional to the square of the power supply voltage VDD. Whether the large power amplifier 12 operates in the linear mode or in the saturation mode is determined by the input level of the large power amplifier 12, namely, the output level of the medium power amplifier 19.

In the input/output characteristic in FIG. 3, for example, if the input level of the large power amplifier 12 is set to +5 dBm, the large power amplifier 12 operates in the saturation operation region. At this time, the voltage value of the amplitude component of the modulation signal is input to the R input terminal 33 in the level range shifted in response to the power control level, whereby the power supply voltage VDD of the power supply terminal 25 is amplitude-modulated, polar coordinate modulation is executed, and highly efficient power amplification is performed while transmission power is controlled.

In this case, for example, at power control level 8, if the input level of the large power amplifier 12 is fixed to +5 dBm and the power supply voltage VDD of the power supply terminal 25 is changed in the range of 0.31 V to 1.96 V and is amplitude-modulated, a modulation amplification signal changing from about +15 dBm to +31 dBm as the output level of the large power amplifier 12 is obtained. Thus, the large power amplifier 12 is operated in the saturation operation region and polar coordinate modulation is executed, whereby the input modulation signal can be amplified with a high degree of efficiency. The control range of the power supply voltage VDD in the saturation mode is 0.31 V to 1.96V at voltage control level 8, 0.25 V to 1.56V at voltage control level 9, or 0.20 V to 1.24V at level 10; each almost equals the amplitude dynamic range (about 16 dB) of modulation signal.

On the other hand, in the input/output characteristic in FIG. 3, for example, if the input level of the large power amplifier 12 is set to −4 dBm, the large power amplifier 12 operates in the linear operation region. At this time, for example, at power control level 11, if the power supply voltage VDD of the power supply terminal 25 is fixed to 0.99 V and a quadrature modulation signal passed through the quadrature modulator 18 and the medium power amplifier 19 is input, an amplification signal of about 22 dBm at the average output level is obtained from the large power amplifier 12. Thus, the large power amplifier 12 is operated in the linear mode and the power supply voltage VDD of the power supply terminal 25 is varied in response to the power control level, whereby transmission power control can be performed independently of the amplitude dynamic range of modulation signal (about 16 dB).

In the description given above, the transmission power control for operating the large power amplifier 12 in the linear mode is performed by the transmission output control signal input from the R input terminal 33, but may be performed using the gain control signal input from the gain control terminal 34 as the transmission output control signal.

The large power amplifier having the input/output characteristics in FIGS. 3 and 4 is switched between the saturation mode and the linear mode at the level lower than the maximum transmission power by 4 dB because the gain variable width is only about 20 dB and the amplitude dynamic range of the modulation signal of the EGPRS system is about 16 dB, but the invention is not limited to it. For the value of the maximum transmission power −4 dB, 4 dB or more may be set if the gain variable width of the large power amplifier is large or 4 dB or less may be set if the gain variable width is small.

In FIG. 1, all power supplies at the three stages of the large power amplifier are connected to one point and the small signal gain changes in response to the power supply voltage in the linear region as shown in FIG. 3 by way of example; however, to change only the power supply voltage at the last stage or at the last two stages, the small signal gain does not change if the power supply voltage changes. In such a case, the gain control in the linear mode may be performed by controlling the output of the medium power amplifier.

Thus, in the first embodiment, in the high frequency power amplifier of the transmission section, highly efficient polar coordinate modulation is performed in the vicinity of the maximum output where the power consumption is the largest and linear amplification is performed at the lower output level, whereby the output control variable width can be widened. The transmission power control in such a wide range exceeding the gain variable width in the large power amplifier as in the example described above is also easily possible. Therefore, polar coordinate modulation is performed only when the transmitter is used in the vicinity of the maximum transmission power, whereby the polar coordinate modulation and the transmission power control can be performed separately, dynamic range shortage in the polar coordinate modulation system can be eased, and a wide range of output levels can be covered.

Second Embodiment

Figure 5:
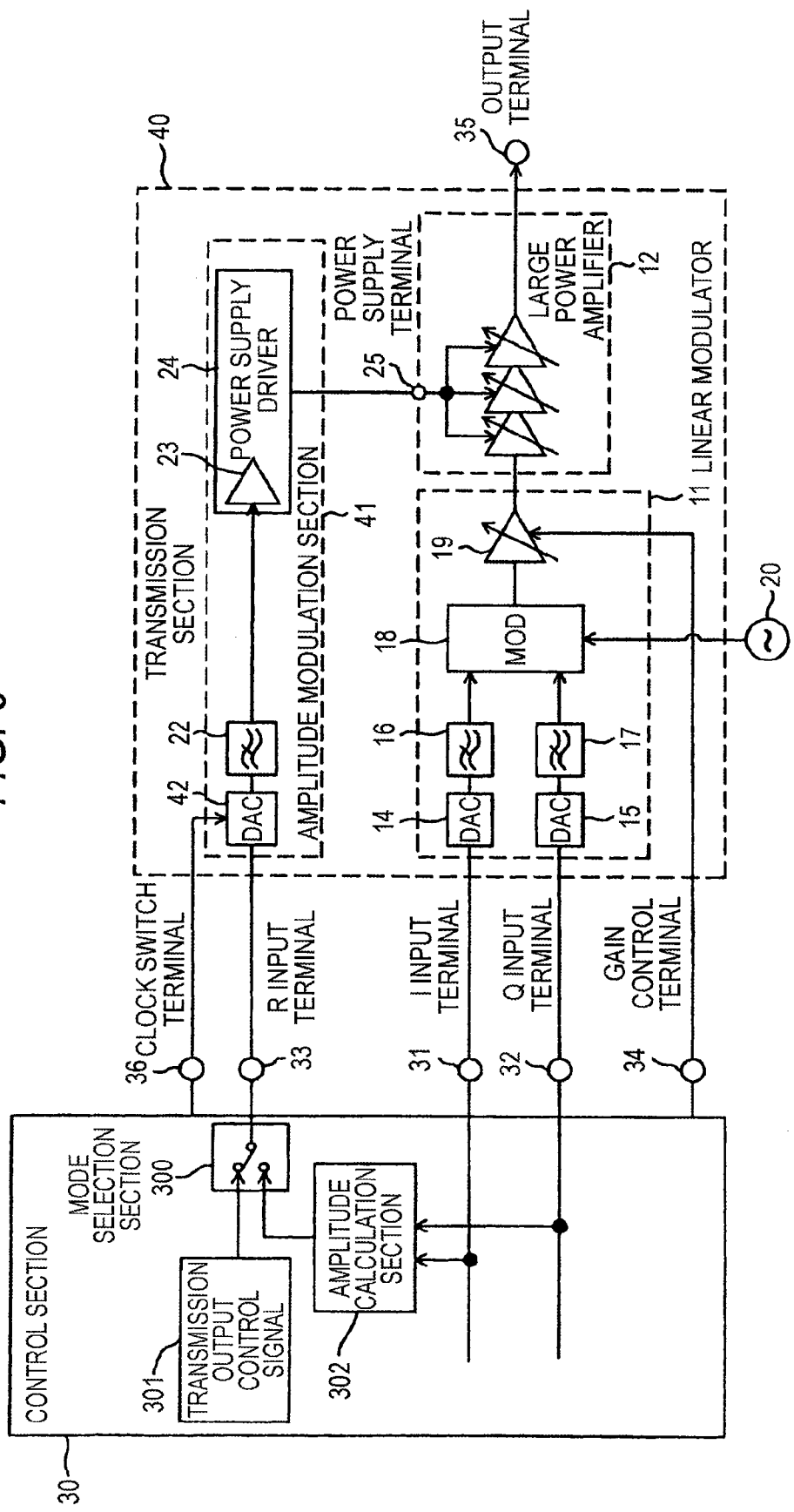
FIG. 5 A block diagram to show the configuration of a transmitter according to a second embodiment of the invention.

FIG. 5 is a block diagram to show the configuration of a transmitter according to a second embodiment of the invention. A transmission section 40 of the second embodiment differs from the transmission section of the first embodiment in part of the configuration; the configuration of the amplitude modulation section is changed, a clock switch terminal 36 is provided, and it is made possible to control operation current by changing an operation clock of a DA converter.

An amplitude modulation section 41 includes a variable clock input DA converter (DAC) 42 that can change the operation clock according to a switch signal from the clock switch terminal 36 in a transmission output control signal input section. Other components are similar to those of the first embodiment and similar components are denoted by the same reference numerals and will not be discussed again.

The variable clock input DA converter 42, which has an operation clock switch function, can change the operation clock in response to input of a switch signal to the clock switch terminal 36 from a control section 30 and can change the operation current in response to the frequency of the operation clock.

Since generally the transmission power control speed is lower than the amplitude change speed of a modulation signal, the DA converter 42 does not require a high operation clock when performing quadrature modulation and linear amplification in a linear mode. Thus, the DA converter 42 may be operated with a high operation clock only when polar coordinate modulation is performed. Therefore, when a large power amplifier 12 is operated in a saturation mode for performing polar coordinate modulation, the operation current of the variable clock input DA converter 42 is increased and the operation clock is raised. On the other hand, when the large power amplifier 12 is operated in the linear mode for performing quadrature modulation and linear amplification, the operation current of the variable clock input DA converter 42 is decreased and the operation clock is lowered.

Thus, according to the second embodiment, the operation clock of the variable clock input DA converter is raised and the operation current is increased only when polar coordinate modulation is performed, whereby the operation current at the linear mode operation time can be decreased and the whole power consumption can be reduced in addition to the advantages of the first embodiment.

Third Embodiment

Figure 6:
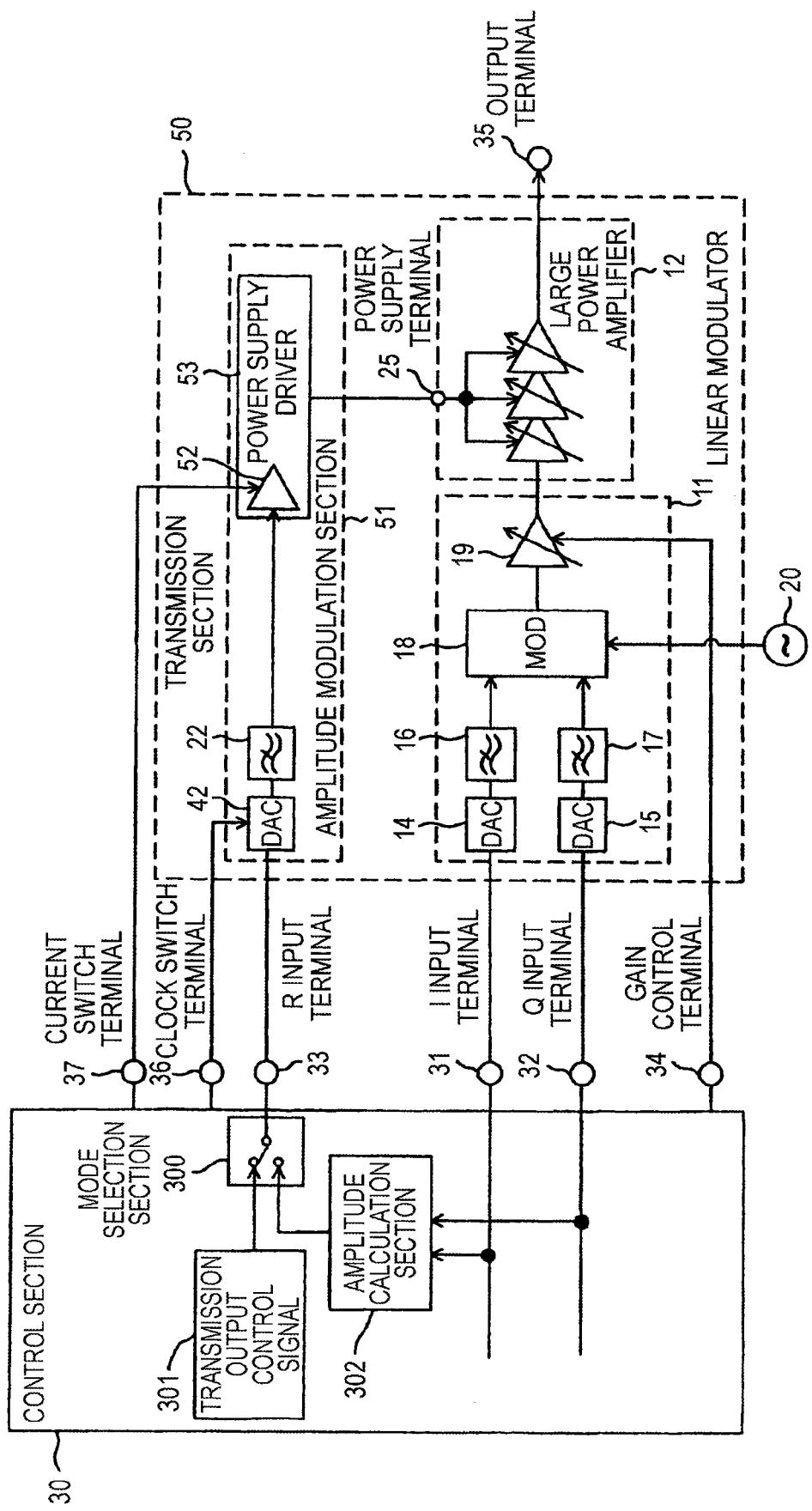
FIG. 6 A block diagram to show the configuration of a transmitter according to a third embodiment of the invention.

FIG. 6 is a block diagram to show the configuration of a transmitter according to a third embodiment of the invention. A transmission section 50 of the third embodiment differs from the transmission section of the second embodiment in part of the configuration; the configuration of the amplitude modulation section is changed, a current switch terminal 37 is provided, and it is made possible to control operation current of a high-speed operational amplifier of a power supply driver.

An amplitude modulation section 51 has a power supply driver 53 including a high-speed operational amplifier (OPAMP) 52 that can change the operation current according to a switch signal from the current switch terminal 37 in an input section. Other components are similar to those of the first and second embodiments and similar components are denoted by the same reference numerals and will not be discussed again.

The high-speed operational amplifier 52, which has an operation current switch function, can vary the operation current in response to input of a switch signal to the current switch terminal 37 from a control section 30.

Since generally the transmission power control speed is lower than the amplitude change speed of a modulation signal, the high-speed operational amplifier 52 for waveform shaping at the input stage of the power supply driver 53 does not require a large operation current when performing quadrature modulation and linear amplification in a linear mode. Thus, the high-speed operational amplifier 52 may be operated with a large operation current only when polar coordinate modulation is performed. Therefore, when a large power amplifier 12 is operated in a saturation mode for performing polar coordinate modulation, the operation current of the high-speed operational amplifier 52 is increased; when the large power amplifier 12 is operated in the linear mode for performing quadrature modulation and linear amplification, the operation current of the high-speed operational amplifier 52 is decreased.

Thus, according to the third embodiment, the operation current of the high-speed operational amplifier 52 is increased only when polar coordinate modulation is performed, whereby the operation current at the linear mode operation time can be decreased and the whole power consumption can be reduced more than the second embodiment.

Fourth Embodiment

Figure 7:
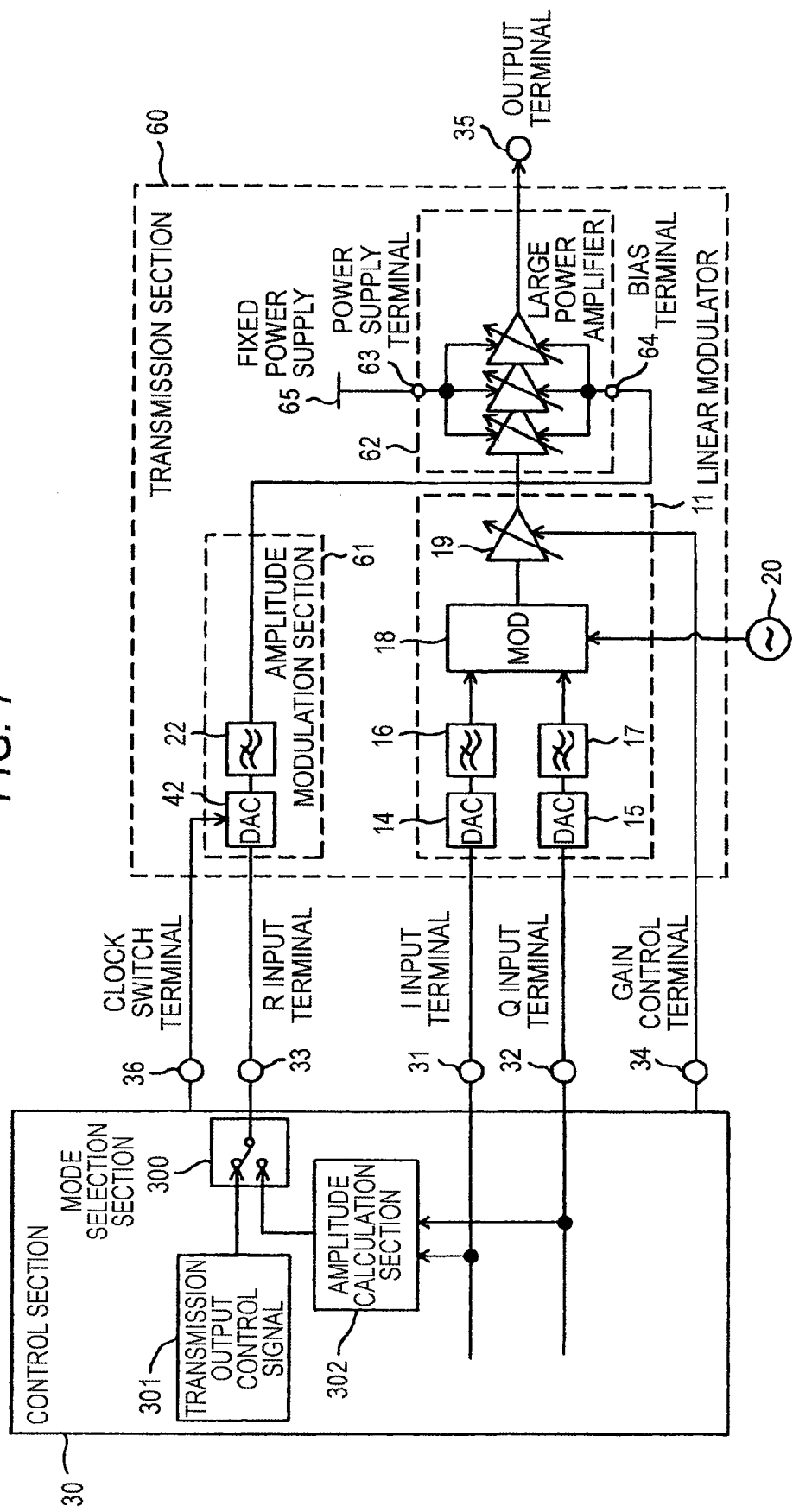
FIG. 7 A block diagram to show the configuration of a transmitter according to a fourth embodiment of the invention.

FIG. 7 is a block diagram to show the configuration of a transmitter according to a fourth embodiment of the invention. A transmission section 60 of the fourth embodiment differs from the transmission section of the second embodiment in part of the configuration; the configurations of the amplitude modulation section and the large power amplifier are changed so that output control of large power amplifier is performed by bias adjustment rather than power supply voltage.

An amplitude modulation section 61 includes a variable clock input DA converter 42 and a low-pass filter 22. A large power amplifier 62 includes a power supply terminal 63 for inputting power supply voltage from a fixed power supply 65 and a bias terminal 64 for inputting a transmission output control signal (gain control signal) output from the amplitude modulation section 61. In the embodiment, the bias terminal 64 in the large power amplifier 62 becomes an output control input terminal. Other components are similar to those of the first embodiment and similar components are denoted by the same reference numerals and will not be discussed again.

In the large power amplifier 62, the drain or the collector of an amplification element becomes the power supply terminal 63, and the gate or the base becomes the bias terminal 64. In the configuration, transmission power control when polar coordinate modulation is executed is performed by a gain control signal input to the bias terminal 64 and thus the amplitude modulation section 61 need not contain a power supply driver to enhance the power supply current capacity as compared with the case where transmission power control is performed directly by power supply input to the power supply terminal 63.

When the large power amplifier 62 amplifies an input modulation signal from a linear modulator 11, fixed power supply voltage is supplied from the fixed power supply 65 to the power supply terminal 63 and a modulation signal or a fixed-level gain control signal from the amplitude modulation section 61 is input to the bias terminal 64 and the output level is adjusted.

In the example described above, the DA converter 42 at the input stage of the amplitude modulation section 61 makes it possible to vary the operation clock and the operation current by a switch signal from a clock switch terminal 36, but a fixed clock input DA converter 21 may be provided for operating with a fixed operation clock as in the first embodiment.

Thus, according to the fourth embodiment, transmission power control is performed by bias adjustment of the large power amplifier, whereby the need for a power supply driver to enhance the power supply current capacity in the amplitude modulation section can be eliminated, and the circuitry can be furthermore simplified as compared with the circuitry of the first to third embodiments.

Fifth Embodiment

Figure 8:
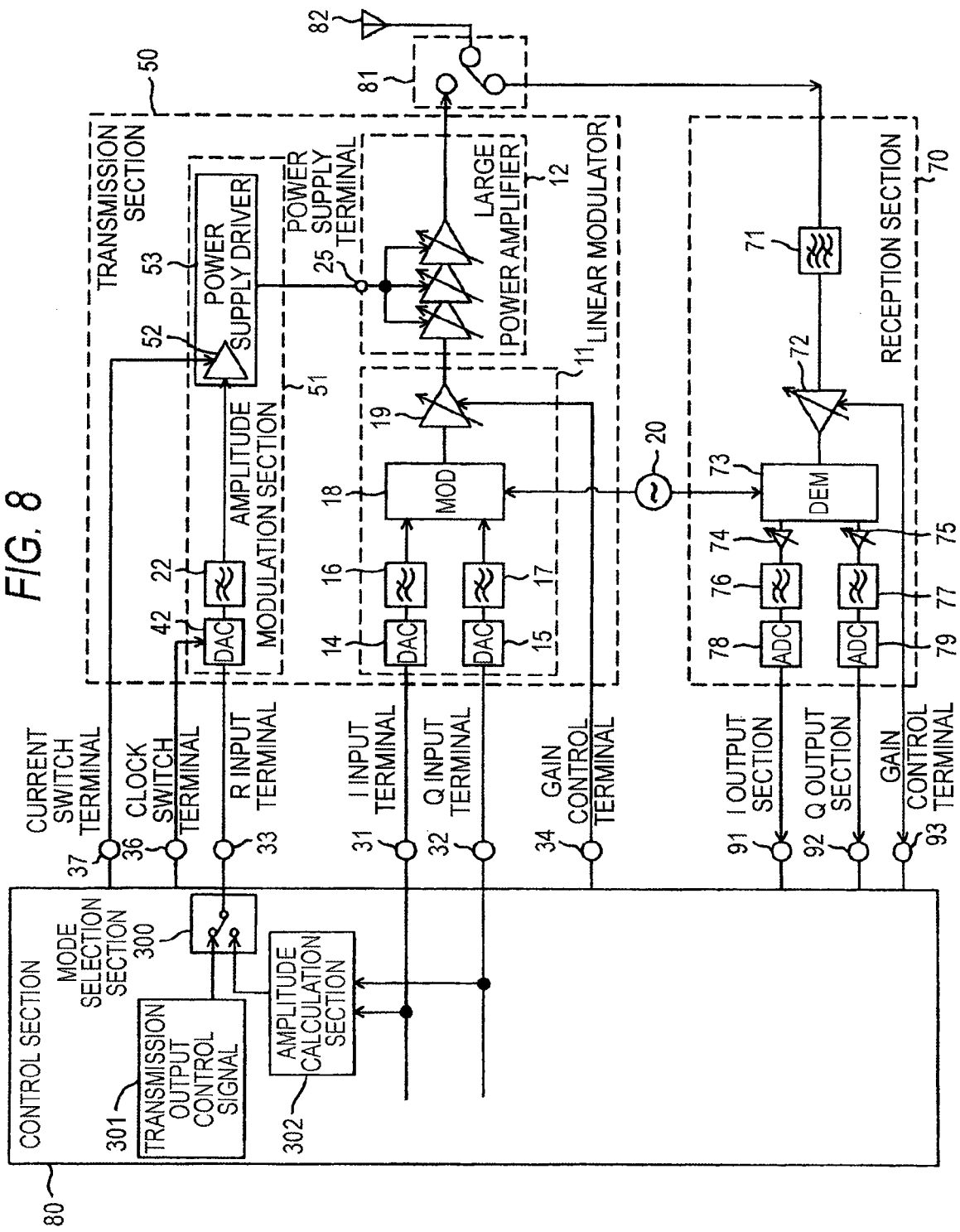
FIG. 8 A block diagram to show the configuration of a wireless communication apparatus according to a fifth embodiment of the invention.

FIG. 8 is a block diagram to show the configuration of a wireless communication apparatus according to a fifth embodiment of the invention. The wireless communication apparatus of the fifth embodiment includes a transmission section 50 like that in the third embodiment, a reception section 70, a control section 80, an antenna switch 81, and an antenna 82.

The reception section 70 contains a demodulation section and includes a band-pass filter (BPF) 71, a low noise amplifier 72 for adjusting the output level of the band-pass filter 71, a quadrature demodulator (DEM) 73 for executing quadrature demodulation of output of the low noise amplifier 72 using a high frequency signal of a local oscillator 20 and executing frequency conversion to a baseband, baseband amplifiers (BBAMPs) 74 and 75 for amplifying the in-phase component and the quadrature component of output of the quadrature demodulator 73 respectively, low-pass filters 76 and 77, and AD converters 78 and 79 for performing analog-digital conversion.

The reception section 70 has an I output terminal 91 of an in-phase component output terminal, a Q output terminal 92 of a quadrature component output terminal, and a gain control terminal 93 for inputting a gain control signal for controlling the amplification gain of the low noise amplifier 72.

The control section 80 is connected to an I input terminal 31, a Q input terminal 32, an R input terminal 33, a gain control terminal 34, a clock switch terminal 36, and a current switch terminal 37 of the transmission section 50, and the I output terminal 91, the Q output terminal 92, and the gain control terminal 93 of the reception section 70, and outputs a transmission modulation signal, inputs a reception demodulation signal, outputs various control signals, etc., and controls the wireless communication operation.

In the fifth embodiment, output of the transmission section 50 is monitored by the reception section 70 and timing adjustment of amplitude information and phase information at the polar coordinate modulation time is executed based on information provided by a demodulation signal. Thus, an operation mode wherein transmission-reception simultaneous operation can be performed is provided even for a TDMA system involving no transmission-reception simultaneous operation.

The antenna switch 81 is switched for connecting the antenna 82 to the reception section 70, and output of the transmission section 50 is attenuated according to the isolation characteristic of the antenna switch 81 (usually about 20 dB) and is transmitted to the band-pass filter 71. In the band-pass filter 71, a large attenuation amount difference occurs between a TDD system using the same frequency for transmission and reception and an FDD system using separate frequencies for transmission and reception, and the output of the transmission section 50 is further attenuated. In the low noise amplifier 72, the gain is adjusted by a gain control signal from the gain control terminal 93 and output of the band-pass filter 71 is attenuated to the level at which the quadrature demodulator 73 is not distorted. The quadrature demodulator 73 executes quadrature demodulation of the output signal of the low noise amplifier 72 using a high frequency signal input from the same local oscillator 20 as the transmission section 50, and the baseband amplifiers 74 and 75 amplify the in-phase component (I signal) and the quadrature component (Q signal) of the output signal of the quadrature demodulator 73 respectively. The I and Q signals have unnecessary harmonic components removed through the low-pass filters 76 and 77 respectively and then are converted into digital signals by the AD converters 78 and 79 respectively for output.

The control section 80 controls the signals so as to provide appropriate output characteristic in the transmission section 50 based on information of demodulation signal provided by the I signal from the I output terminal 91 and the Q signal from the Q output terminal 92. For example, the timings of a transmission output control signal input to the R input terminal 33 and the I and Q signals input to the I input terminal 31 and the Q input terminal 32 are adjusted so that EVM (error vector magnitude (value indicating modulation accuracy)) becomes the minimum. Accordingly, the timing of amplitude modulation when polar coordinate modulation is performed in a large power amplifier 12 can be adjusted.

In the example described above, the local oscillator 20 is common to transmission and reception; however, to apply the invention to a system requiring a local oscillator having the same reference signal source separately for transmission and reception, such as W-CDMA, the circuitry need not be made common and the oscillation frequency needs only to be made the same.

Thus, according to the fifth embodiment, it is made possible to make the timing adjustment of amplitude information and phase information at the polar coordinate modulation time based on information of the demodulation signal provided by connecting output of the transmission section 50 to the reception section 70 through the antenna switch 81 and demodulating output of the transmission section 50, and distortion in the transmission section can be furthermore lessened as compared with the third embodiment.

Sixth Embodiment

Figure 9:
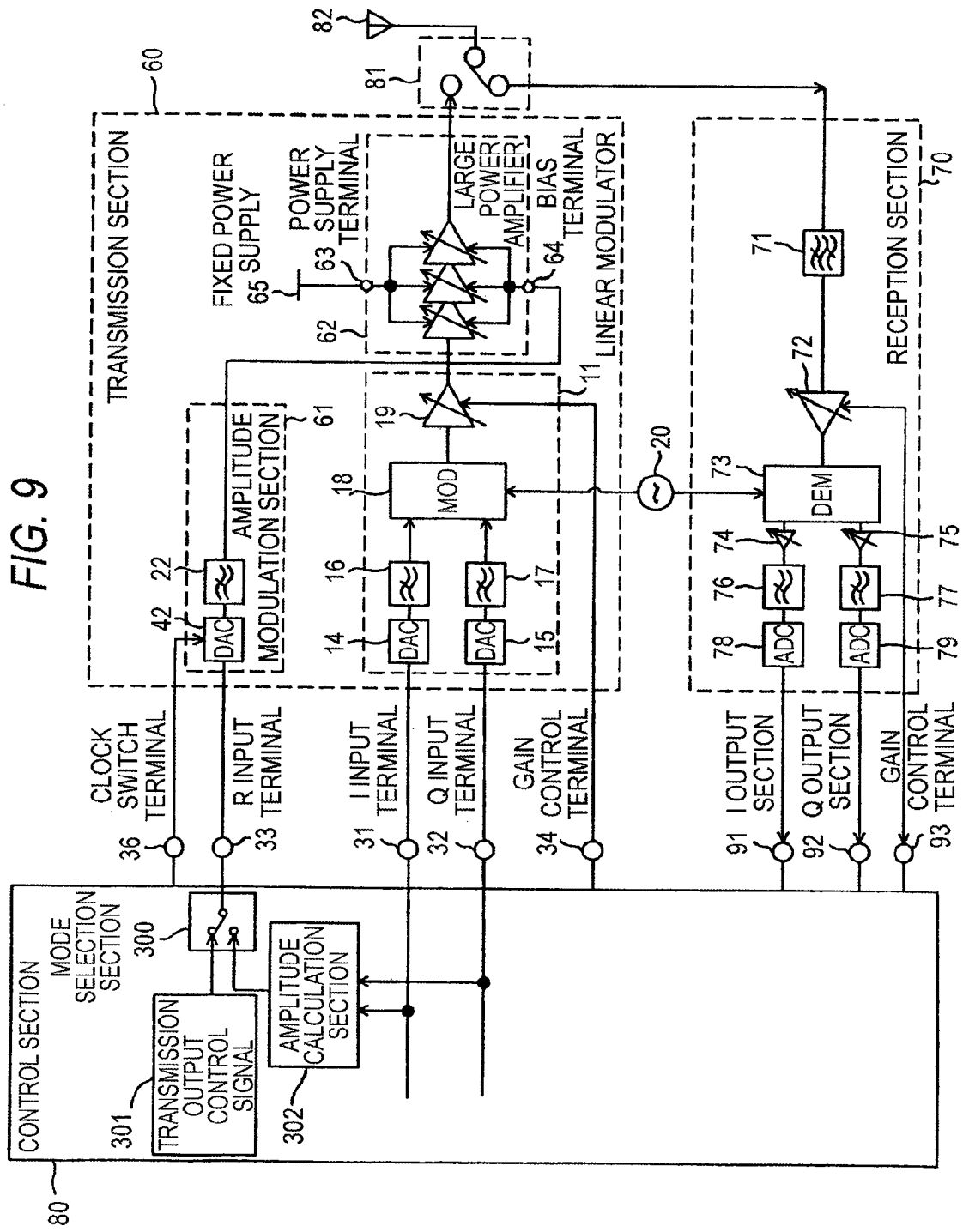
FIG. 9 A block diagram to show the configuration of a wireless communication apparatus according to a sixth embodiment of the invention.

FIG. 9 is a block diagram to show the configuration of a wireless communication apparatus according to a sixth embodiment of the invention. The wireless communication apparatus of the sixth embodiment includes a transmission section 60 like that in the fourth embodiment, a reception section 70, a control section 80, an antenna switch 81, and an antenna 82. That is, the transmission section in the fifth embodiment described above is changed to the transmission section 60 for performing output control of a large power amplifier by bias adjustment as in the fourth embodiment. The configurations and the operation of the reception section 70 and the control section 80 are similar to those in the fifth embodiment and will not be discussed again.

The transmission section 60 performs transmission power control when polar coordinate modulation is executed is performed by a gain control signal input to a bias terminal 64 and thus an amplitude modulation section 61 need not contain a power supply driver to enhance the power supply current capacity as compared with the case where transmission power control is performed directly by power supply input to a power supply terminal 63.

In the example described above, a DA converter 42 at the input stage of the amplitude modulation section 61 makes it possible to vary the operation clock and the operation current by a switch signal from a clock switch terminal 36, but a fixed clock input DA converter 21 may be provided for operating with a fixed operation clock as in the first embodiment.

Thus, according to the sixth embodiment, transmission power control is performed by bias adjustment of the large power amplifier, whereby the need for a power supply driver to enhance the power supply current capacity in the amplitude modulation section can be eliminated, and the circuitry can be furthermore simplified in addition to the advantages of the fifth embodiment.

Seventh Embodiment

Figure 10:
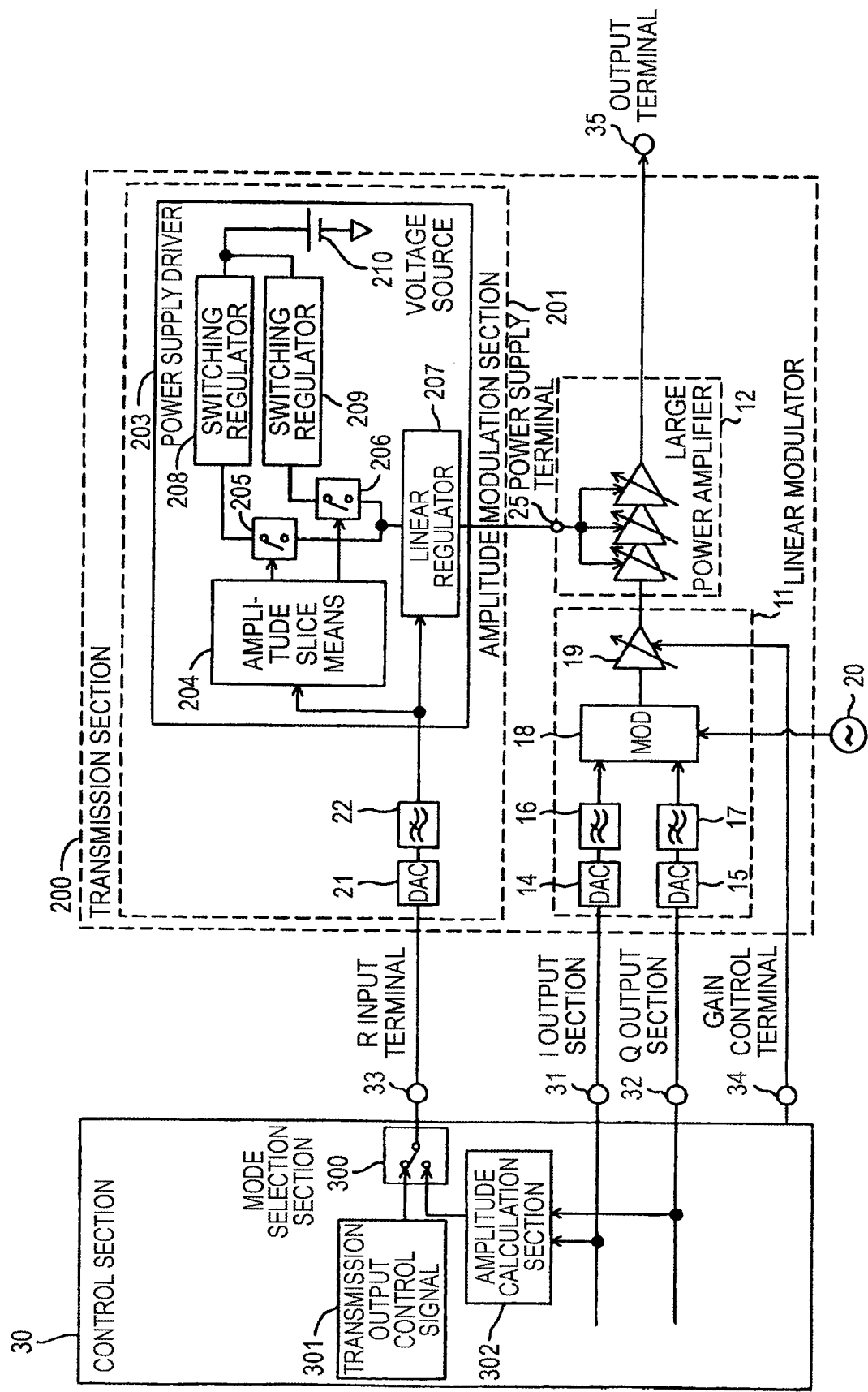
FIG. 10 A block diagram to show the configuration of a transmitter according to a seventh embodiment of the invention.
Figure 11:
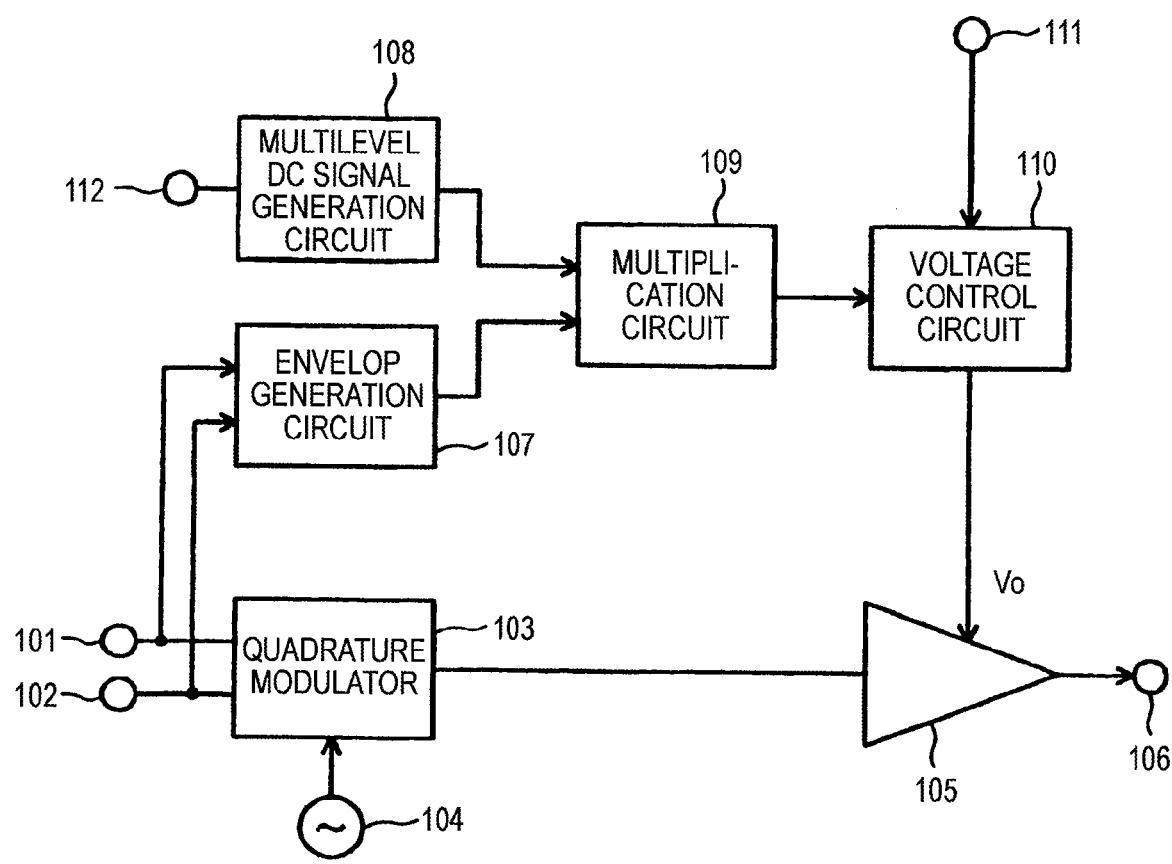
FIG. 11 A block diagram to show the configuration of an output variable transmitter in a related art example.

FIG. 10 is a block diagram to show the configuration of a transmitter according to a seventh embodiment of the invention. A transmission section 200 of the seventh embodiment differs from the transmission section of the first embodiment in part of the configuration; the configuration of a power supply driver 203 of an amplitude modulation section 201 is changed. The power supply driver 203 includes amplitude slice means 204 for slicing a transmission output control signal at stepwise different voltage levels, a linear regulator 207, a voltage source 210, switching regulators 208 and 209 for converting the power supply voltage of the voltage source 210 into voltages of stepwise different values, and switch group 205, 206 for selecting any one of the output voltages of the switching regulators 208 and 209. Other components are similar to those of the first embodiment and similar components are denoted by the same reference numerals and will not be discussed again.

Output of a low-pass filter 22 is divided into two, which are input to the amplitude slice means 204 and the linear regulator 207. The amplitude slice means 204 slices the output of the low-pass filter 22 at stepwise different voltage levels, and the switching regulators 208 and 209 each implemented as a DC-DC converter, etc., convert the power supply voltage of the voltage source 210 into voltages of stepwise different values. In the linear regulator 207, the difference between output of the voltage source 210 and output of the low-pass filter 22 becomes a loss, but if the output of the low-pass filter 22 is low, the switching regulator of the output voltage higher than and closest to the output of the low-pass filter 22 is selected by the switch group 205, 206, whereby the loss can be minimized.

Thus, according to the seventh embodiment, a plurality of switching regulators and the linear regulator are used in combination as the power supply driver 203, whereby the operation current at the polar coordinate modulation time can be decreased and the whole power consumption can be reduced more than the first embodiment.

As described above, according to the embodiment, highly efficient polar coordinate modulation can be executed in the vicinity of the maximum output with the largest power consumption independently of the transmission power control. Polar coordinate modulation is performed only when the apparatus is used in the vicinity of the maximum transmission power, whereby dynamic range shortage depending on the performance of the power amplifier can be eased and the output control variable width can be widened while highly efficient output power amplification according to the polar coordinate modulation system is performed.

In the embodiments described above, applying the invention to the mobile telephones of the 900-MHz band EGPRS system of the European mobile telephone standard is shown by way of example, but the invention is not limited to the case. The invention can also be applied to the transmission sections of various mobile telephones of GSM, W-CDMA, etc., other wireless terminals, wireless base station apparatus, wireless communication apparatus for wireless LAN of IEEE802.11a, 802.11b, etc.

While the invention has been described in detail with reference to the specific embodiments, it will be obvious to those skilled in the art that various changes and modifications can be made without departing from the spirit and the scope of the invention.

The present application is based on Japanese Patent Application No. (2004-017955) filed on Jan. 27, 2004 and Japanese Patent Application No. (2004-352464) filed on Dec. 6, 2004, which are incorporated herein by reference.

INDUSTRIAL APPLICABILITY

The invention has the advantage that it can provide the transmission section capable of providing wide output control variable width with high efficiency, and is useful for a transmitter whose output can be controlled variably, a wireless communication apparatus using the transmitter, etc.

The invention claimed is:

1. A transmitter comprising:
   a quadrature modulation unit which inputs an in-phase component and a quadrature component of an input modulation signal and performs quadrature modulation;
   a variable gain amplification unit which amplifies an output of the quadrature modulation unit with a predetermined gain being controlled based on a gain control signal; and
   a power amplification unit which performs power amplification of an output of the variable gain amplification unit,
   wherein the power amplification unit has a linear mode for performing power amplification using a linear operation region in an input/output power characteristic and a saturation mode for performing power amplification using a saturation operation region in the input/output power characteristic, and
   wherein, if transmission output power of the power amplification unit is equal to or greater than a predetermined value, the output level of the variable gain amplification unit is adjusted, the power amplification unit is operated in the saturation mode, and a transmission output control signal amplitude-modulated based on an amplitude component of the input modulation signal is input to an output control input terminal of the power amplification unit for performing polar coordinate modulation; if the transmission output power is less than the predetermined value, the output level of the variable gain amplification unit is adjusted, the power amplification unit is operated in the linear mode, and a transmission output control signal of a predetermined level responsive to the transmission output power is input to the output control input terminal for performing linear amplification.

2. The transmitter according to claim 1,
   wherein if the transmission output power is at a maximum output level or proximity thereof the power amplification unit performs the polar coordinate modulation and if the transmission output power is smaller than the maximum output level or proximity thereof, the power amplification unit performs the linear amplification.

3. The transmitter according to claim 1,
wherein the power amplification unit comprises a power supply terminal used as the output control input terminal, and
wherein the transmitter further comprises a power supply driver for increasing the current capacity of the signal of the predetermined level or the signal amplitude-modulated based on the amplitude component of the input modulation signal and supplying power to the power supply terminal as the transmission output control signal.

4. The transmitter according to claim 3,
wherein an input section of the power supply driver comprises an operational amplifier for waveform shaping, and
wherein the operational amplifier can change an operation current and has an operation current switch function for increasing the operation current as compared with that when the linear amplification is performed only when the polar coordinate modulation is performed in the power amplification unit.

5. The transmitter according to claim 3, wherein the power supply driver is a liner regulator.

6. The transmitter according to claim 3, wherein the power supply driver is a switching regulator.

7. The transmitter according to claim 1, wherein the power amplification unit comprises:
a power supply terminal to which fixed power supply is input; and
an amplification circuit bias terminal used as the output control input terminal to which the transmission output control signal is input.

8. The transmitter according to claim 1, further comprising a transmission output control signal input section for inputting the transmission output control signal,
wherein the transmission output control signal input section comprises a DA converter for converting a digital signal into an analog signal, and
wherein the DA converter can change an operation clock and has an operation clock switch function for operating with a higher operation clock than that when the linear amplification is performed only when the polar coordinate modulation is performed in the power amplification unit.

9. The transmitter according to claim 1, further comprising:
a demodulation section for demodulating an output of the power amplification unit; and
a control section for adjusting the timing of amplitude modulation when the polar coordinate modulation is performed in the power amplification unit based on information of a demodulation signal provided by the demodulation section.

10. A wireless communication apparatus comprising the transmitter as claimed in claim 1.

11. A transmitter comprising:
a quadrature modulation unit which inputs an in-phase component and a quadrature component of an input modulation signal and performs quadrature modulation;
a variable gain amplification unit which amplifies an output of the quadrature modulation unit with a predetermined gain being controlled based on a gain control signal; and
a power amplification unit which performs power amplification of an output of the variable gain amplification unit,
wherein the power amplification unit has a linear mode for performing power amplification using a linear operation region in an input/output power characteristic and a saturation mode for performing power amplification using a saturation operation region in the input/output power characteristic,
wherein, if transmission output power of the power amplification unit is equal to or greater than a predetermined value, the output level of the variable gain amplification unit is adjusted, the power amplification unit is operated in the saturation mode, and a transmission output control signal amplitude-modulated based on an amplitude component of the input modulation signal is input to an output control input terminal of the power amplification unit for performing polar coordinate modulation; if the transmission output power is less than the predetermined value, the output level of the variable gain amplification unit is adjusted, the power amplification unit is operated in the linear mode, and a transmission output control signal of a predetermined level responsive to the transmission output power is input to the output control input terminal for performing linear amplification,
wherein the power amplification unit comprises a power supply terminal used as the output control input terminal,
wherein the transmitter further comprises a power supply driver for increasing the current capacity of the signal of the predetermined level or the signal amplitude-modulated based on the amplitude component of the input modulation signal and supplying power to the power supply terminal as the transmission output control signal, and
wherein the power supply driver comprises:
an amplitude slice unit which slices the transmission output control signal at stepwise different voltage levels;
a plurality of switching regulators for converting power supply voltage into voltages of stepwise different values; and
a switch group for selecting any one of the output voltages of the plurality of switching regulators.

* * * * *